United States Patent
Goss et al.

(10) Patent No.: US 11,810,625 B2
(45) Date of Patent: Nov. 7, 2023

(54) SOLID-STATE MEMORY WITH INTELLIGENT CELL CALIBRATION

(71) Applicant: Seagate Technology LLC, Fremont, CA (US)

(72) Inventors: Ryan J. Goss, Prior Lake, MN (US); Christopher A. Smith, Erie, CO (US); Indrajit Zagade, Pune (IN); Jonathan Henze, Savage, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/499,418

(22) Filed: Oct. 12, 2021

(65) Prior Publication Data
US 2022/0115076 A1    Apr. 14, 2022

Related U.S. Application Data

(60) Provisional application No. 63/198,302, filed on Oct. 9, 2020.

(51) Int. Cl.
*G11C 16/26* (2006.01)
*G11C 29/38* (2006.01)
*G11C 16/04* (2006.01)

(52) U.S. Cl.
CPC .......... *G11C 16/26* (2013.01); *G11C 29/38* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 7,251,648 B2 | 7/2007 | Chaudhuri et al. | |
| 8,040,725 B2 | 10/2011 | Kang | |
| 8,213,236 B1* | 7/2012 | Wu | G11C 16/10 365/185.24 |
| 8,213,255 B2 | 7/2012 | Hemink et al. | |
| 8,363,478 B1* | 1/2013 | Yang | G11C 16/28 365/185.24 |
| 9,076,545 B2 | 7/2015 | Mokhlesi | |
| 9,607,710 B2 | 3/2017 | Zhang et al. | |
| 9,659,664 B1* | 5/2017 | Griffin | G11C 11/5628 |
| 2015/0127883 A1* | 5/2015 | Chen | G06F 11/1402 711/103 |

(Continued)

FOREIGN PATENT DOCUMENTS

KR    10-2018-0110412    * 10/2018

*Primary Examiner* — April Y Blair
*Assistant Examiner* — Matthew W Wahlin
(74) *Attorney, Agent, or Firm* — Hall Estill Law Firm; Randall K. McCarthy

(57) ABSTRACT

A solid-state memory may have many non-individually erasable memory cells arranged into calibration groups with each memory cell in each respective calibration group using a common set of read voltages to sense programmed states. An evaluation circuit of the solid-state memory may be configured to measure at least one read parameter for each calibration group responsive to read operations carried out upon the memory cells in the associated calibration group. An adjustment circuit of the solid-state memory may redistribute the memory cells of an existing calibration group into at least one new calibration group in response to the at least one measured read parameter.

20 Claims, 7 Drawing Sheets

(56) References Cited

U.S. PATENT DOCUMENTS

2016/0147582 A1* 5/2016 Karakulak ............ G06F 11/079
 714/37
2020/0066354 A1* 2/2020 Ioannou ................. G11C 16/26

* cited by examiner

SOLID-STATE MEMORY WITH INTELLIGENT CELL CALIBRATION

RELATED APPLICATION

The present application makes a claim of domestic priority to U.S. Provisional Patent Application No. 63/198,302 filed Oct. 9, 2020, the contents of which are hereby incorporated by reference.

SUMMARY

Various embodiments of the present disclosure are generally directed to the calibration of memory cells in a memory, such as, but not limited to, a flash memory in a solid state drive (SSD).

A solid-state memory, in some embodiments, has many non-individually erasable memory cells arranged into calibration groups with each memory cell in each respective calibration group using a common set of read voltages to sense programmed states. An evaluation circuit of the solid-state memory measures at least one read parameter for each calibration group responsive to read operations carried out upon the memory cells in the associated calibration group. An adjustment circuit of the solid-state memory redistributes the memory cells of an existing calibration group into at least one new calibration group in response to the at least one measured read parameter.

DETAILED DESCRIPTION

Figure 1:
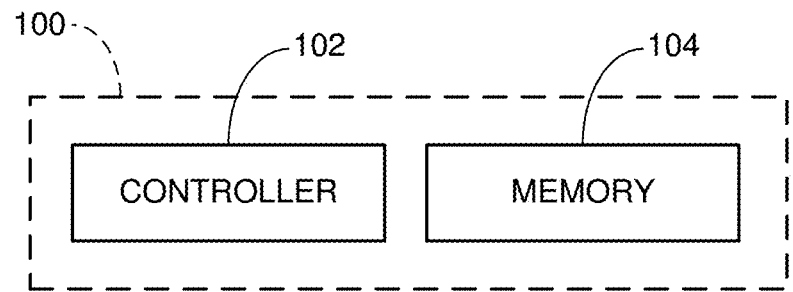
FIG. 1 provides a functional block representation of a data storage device in accordance with various embodiments.

Embodiments of this disclosure, without limitation, are directed to a solid-state memory that maintains data access performance by intelligently conducting at least memory cell calibrations to groups of memory cells.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. Groups of dies may be arranged into NVMe sets in accordance with the NVMe (Non-Volatile Memory Express) Standard. This standard enables multiple owners (users) to access and control separate portions of a given SSD (or other memory device).

Metadata is often generated and used to describe and control the data stored to an SSD. The metadata may take the form of one or more map structures that track the locations of data blocks written to various GCUs (garbage collection units), which are sets of erasure blocks that are erased and allocated as a unit. The map structures can include a forward map and a reverse directory, although other forms can be used.

The forward map provides an overall map structure that can be accessed by a controller to service a received host access command (e.g., a write command, a read command, etc.). The forward map may take the form of a two-level map, where a first level of the map maintains the locations of map pages and a second level of the map provides a flash transition layer (FTL) to provide association of logical addresses of the data blocks to physical addresses at which the blocks are stored. Other forms of maps can be used including single level maps and three-or-more level maps, but each generally provides a forward map structure in which pointers may be used to point to each successive block until the most current version is located.

The reverse directory can be written to the various GCUs and provides local data identifying, by logical address, which data blocks are stored in the associated GCU. The reverse directory, also sometimes referred to as a footer, thus provides a physical to logical association for the locally stored blocks. As with the forward map, the reverse directory can take any number of suitable forms. Reverse directories are particularly useful during garbage collection operations, since a reverse directory can be used to determine which data blocks are still current and should be relocated before the associated erasure blocks in the GCU are erased.

SSDs expend a significant amount of resources on maintaining accurate and up-to-date map structures. Nevertheless, it is possible from time to time to have a mismatch between the forward map and the reverse directory for a given GCU. These situations are usually noted at the time of garbage collection. For example, the forward map may indicate that there are X valid data blocks in a given erasure block (EB), but the reverse directory identifies a different number Y valid blocks in the EB. When this type of mismatch occurs, the garbage collection operation may be rescheduled or may take a longer period of time to complete while the system obtains a correct count before proceeding with the recycling operation.

The NVMe specification provides that a storage device should have the ability to provide guaranteed levels of deterministic performance for specified periods of time (deterministic windows, or DWs). To the extent that a garbage collection operation is scheduled during a DW, it is desirable to ensure that the actual time that the garbage collection operation would require to complete is an accurate estimate in order for the system to decide whether and when to carry out the GC operation.

SSDs include a top level controller circuit and a flash (or other semiconductor) memory module. A number of channels, or lanes, are provided to enable communications between the controller and dies within the flash memory. The dies are further subdivided into planes, GCUs, erasure blocks, pages, etc. Groups of dies may be arranged into separate NVMe sets, or namespaces. This allows the various NVMe sets to be concurrently serviced for different owners (users).

In one nonlimiting example, a 4TB SSD has 128 die connected using 8 channels so that 16 die are connected to each channel. Each die has two planes that support concurrent read or write operations to the same page number (but not necessarily the same erasure blocks, EBs). GCUs nominally are formed using one EB from each of 32 dies. Each page stores 16K of data plus LDPC inner code values. GCU writes are thus formed by writing (nominally) 31 pages of user data, and one page of parity (XOR) data. This will support a loss of a single die. EBs represent the smallest increment of memory that can be erased as a unit, but in practice, garbage collection takes place at the GCU level.

Flash devices can be noisy and thus it is common to write data in the form of code words to individual pages of data. A page may store 16K worth of user payload data, plus some additional number of LDPC (low density parity check) codes, which may be on the order of an additional 5K or so bits. The number and strength of the LDPC codes are used to enable, normally, correct reading back of the payload. Outercode, or parity values, can additionally be written as noted above to correct read errors when the inner code values are insufficient to resolve the error.

Despite the ability to correct errors, the efficient utilization of memory in a solid-state data storage device remains important. With some solid-state memories having a finite lifespan tied to a number of read, write, and erase cycles, such as flash memory, the efficient utilization of memory cells is even more important. The proactive and reactive calibration of memory cells that are not operating at optimal parameters can occupy valuable memory processing capabilities and time while expending the finite lifespan of the memory itself. Hence, intelligent memory cell calibrations is a continued goal that consume minimal system resources and do not degrade real-time data storage performance while minimizing the number of memory cell accesses so that cell lifespan is not unduly tolled.

To achieve the goal of intelligent memory cell calibration in a solid-state memory, a monitor module can be employed that generates a variety of strategies directed to identifying intelligent cell calibration opportunities and executing cell calibrations without degrading the memory itself or the data access performance of a system utilizing the solid-state memory. The ability to efficiently reorganize memory cells that are grouped by operational calibration settings allows a solid-state memory to maintain optimal data access performance despite changes in the memory itself as well as changes in how data are accessed from the memory. The proactive generation of calibration strategies allows a monitor module to intelligently determine when, and if, cell calibrations are necessary to provide optimal data access performance, which allows triggered, or scheduled, cell calibrations to be ignored, accelerated, or otherwise altered to customize the status of the memory cells to the current and/or pending data access operations to the solid-state memory.

These and other features may be practiced in a variety of different data storage devices, but various embodiments conduct wear range optimization in the example data storage device 100 shown as a simplified block representation in FIG. 1. The device 100 has a controller 102 and a memory module 104. The controller block 102 represents a hardware-based and/or programmable processor-based circuit configured to provide top level communication and control functions. The memory module 104 includes solid state non-volatile memory (NVM) for the storage of user data from one or more host devices 106, such as other data storage devices, network server, network node, or remote controller.

Figure 2:
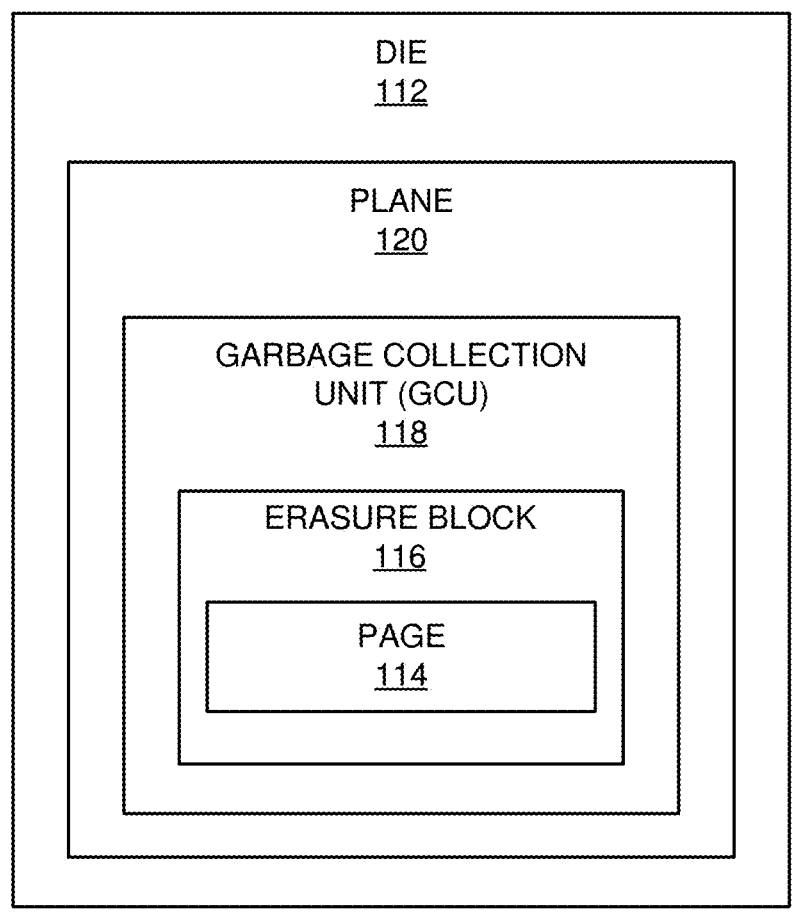
FIG. 2 shows aspects of the device of FIG. 1 characterized as a solid state drive (SSD) in accordance with some embodiments.

FIG. 2 shows a block representation of portions of an example memory 110 arranged in accordance with some embodiments. A memory die 112 can be configured with any solid-state memory cells, such as flash, resistive, phase change, and spin-torque memory, without limitation. The smallest unit of memory that can be accessed at a time is referred to as a page 114. A page 114 may be formed using a number of solid-state memory cells that share a common word line, bit line, or source line. The storage size of a page 114 can vary; current generation flash memory pages can store, in some cases, 16 KB (16,384 bytes) of user data.

A number of pages are integrated into an erasure block 116, which represents the smallest grouping of memory cells that can be concurrently erased in a NAND flash memory. A number of erasure blocks 116 can be arranged into a garbage collection unit (GCU) 118, which may utilize erasure blocks across different dies 112, as explained below. GCUs 118 can be allocated for the storage of data. Once a sufficient amount of the stored data is determined to be stale (e.g., no longer the most current version), a garbage collection operation can be carried out to recycle the GCU 118. This includes identifying and relocating the current version data to a new location, followed by an erasure operation to reset the memory cells. The GCU 118 may then be returned to an allocation pool for subsequent allocation to begin storing new user data.

Each die 112 may include a plurality of planes 120. Examples include two planes per die, four planes per die, etc. although other arrangements can be used. Generally, a plane is a subdivision of the die 112 arranged with separate read/write/erase circuitry such that a given type of access operation (such as a write operation, etc.) can be carried out simultaneously by each of the planes to a common page address within the respective planes.

Figure 3:
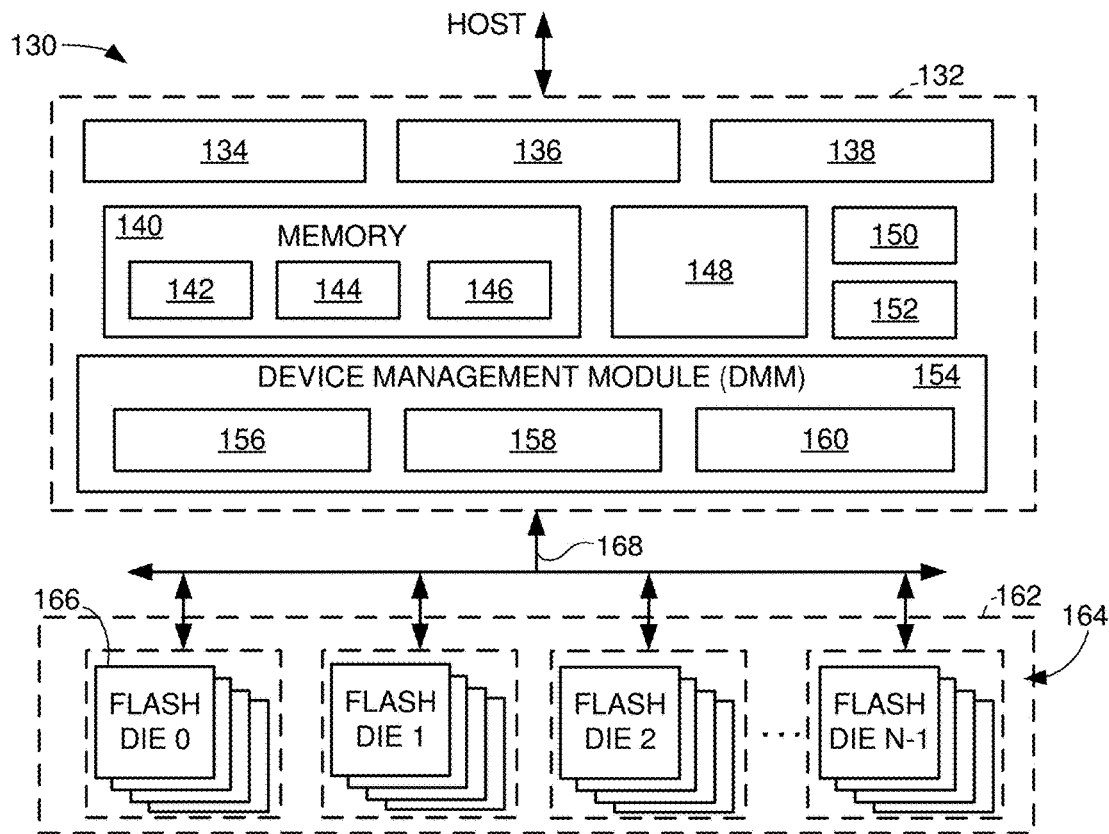
FIG. 3 shows an arrangement of the flash memory of FIG. 2 in some embodiments.

FIG. 3 depicts portions of an example data storage device 130 generally corresponding to the device 100 in FIG. 1. The device 130 is configured as a solid. state drive (SSD) that communicates with one or more host devices via one or more Peripheral Component Interface Express (PCIe) ports, although other configurations can be used. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVMe sets (die sets) for use in the storage of data. Each NVMe set. may form a portion of an NVMe Namespace that may span multiple SSDs or be contained within a single SSD.

The SSD 130 includes a controller circuit 132 with a front end controller 134, a core controller 136 and a back end controller 138. The front end controller 134 performs host I/F functions, the back end controller 138 directs data transfers with the memory module 134 and the core controller 136 provides top level control for the device.

Each controller 134, 136 and 138 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 140 represents various forms of volatile and/or non-volatile memory (e.g., SRAM, DDR DRAM, flash, etc.) utilized as local memory by the controller 132. Various data structures and data sets may be stored by the memory including one or more map structures 142, one or more caches 144 for map data and other control information, and one or more data buffers 146 for the temporary storage of host (user) data during data transfers.

A non-processor based hardware assist circuit 148 may enable the offloading of certain memory management tasks by one or more of the controllers as required. The hardware circuit 148 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 132, such as a data compression block 150 and an encryption block 152. The data compression block 150 applies lossless data compression to input data sets during write operations, and subsequently provides data de-compression during read operations. The encryption block 152 provides any number of cryptographic functions to input data including encryption, hashes, decompression, etc.

A device management module (DMM) 154 supports back end processing operations and may include an outer code engine circuit 156 to generate outer code, a device I/F logic circuit 158 and a low density parity check (LDPC) circuit 160 configured to generate LDPC codes as part of the error detection and correction strategy used to protect the data stored by the by the SSD 130.

A memory module 162 corresponds to the memory 104 in FIG. 1 and includes a non-volatile memory (NVM) in the form of a flash memory 164 distributed across a plural number N of flash memory dies 166. Rudimentary flash memory control electronics (not separately shown in FIG. 3) may be provisioned on each die 166 to facilitate parallel data transfer operations via one or more channels (lanes) 168.

Figure 4:
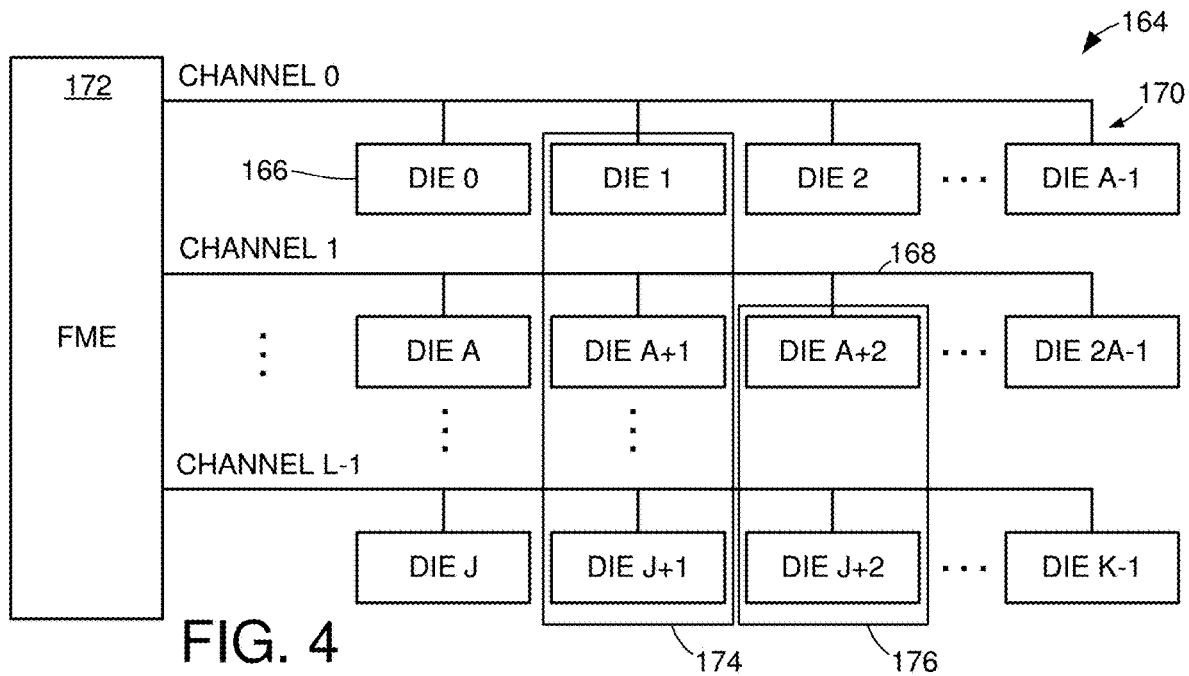
FIG. 4 illustrates the use of channels to access the dies in FIG. 3 in some embodiments.

FIG. 4 shows further aspects of the flash memory 164 arranged in accordance with some embodiments. A total number K dies 166 are provided and arranged into physical die groups 170. Each die group 170 is connected to a separate channel 168 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 172 of the flash memory 164 controls each of the channels 168 to transfer data to and from the dies 166.

In some embodiments, the various dies are arranged into one or more NVMe sets. An NVMe set represents a portion of the storage capacity of the SSD that is allocated for use by a particular host (user/owner). NVMe sets are usually established with a granularity at the die level, so that some percentage of the total available dies 166 will be allocated for incorporation into a given NVMe set.

A first example NVMe set is denoted at 174 in FIG. 4. This first set 174 uses a single die 166 from each of the different channels 168. This arrangement provides fast performance during the servicing of data transfer commands for the set since all eight channels 168 are used to transfer the associated data. A limitation with this approach is that if the set 174 is being serviced, no other NVMe sets can be serviced during that time interval. While the set 174 only uses a single die from each channel, the set could also be configured to use multiple dies from each channel, such as 16 dies/channel, 32 dies/channel, etc.

A second example NVMe set is denoted at 176 in FIG. 4. This set uses dies 166 from less than all of the available channels 168. This arrangement provides relatively slower overall performance during data transfers as compared to the set 174, since for a given size of data transfer, the data will be transferred using fewer channels. However, this arrangement advantageously allows the SSD to service multiple NVMe sets at the same time, provided the sets do not share the same (e.g., an overlapping) channel 168.

Figure 5:
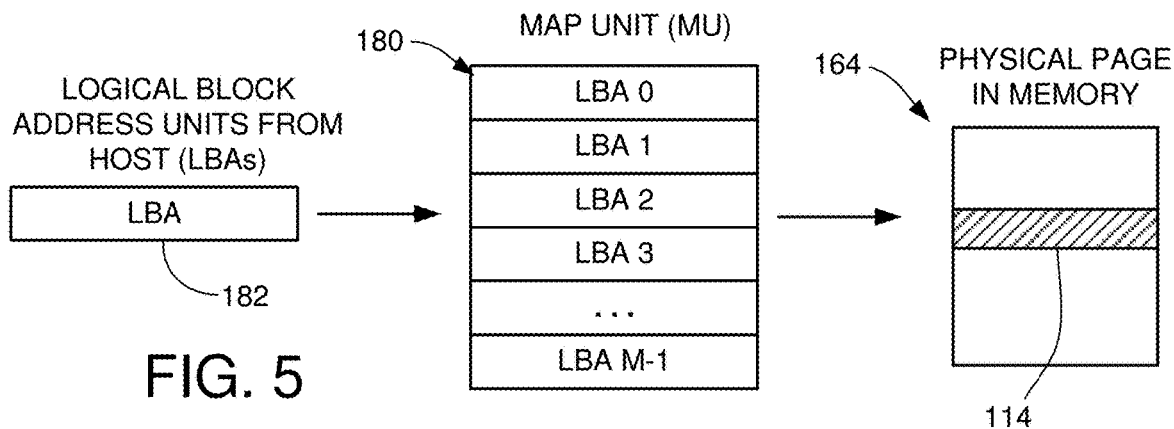
FIG. 5 illustrates a map unit (MU) as a data arrangement stored to the flash memory of FIG. 2.

FIG. 5 illustrates a manner in which data may be stored to a flash memory 164. Map units (MUs) 180 represent fixed sized blocks of data that are made up of one or more user logical block address units (LBAs) 182 supplied by the host. Without limitation, the LBAs 182 may have a first nominal size, such as 512 bytes (B), 1024B (1 KB), etc., and the MUs 180 may have a second nominal size, such as 4096B (4 KB), etc. The application of data compression may cause each MU to have a smaller size in terms of actual bits written to the flash memory 164.

The MUs 180 are arranged into the aforementioned pages 114 (FIG. 2) which are written to the memory 164. In the present example, using an MU size of 4 KB, then nominally four (4) MUs may be written to each page. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are often managed using metadata. The metadata provide map structures to track the locations of various data blocks (e.g., MUAs 180) to enable the SSD 130 to locate the physical location of existing data. For example, during the servicing of a read command it is generally necessary to locate the physical address within the flash memory 166 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
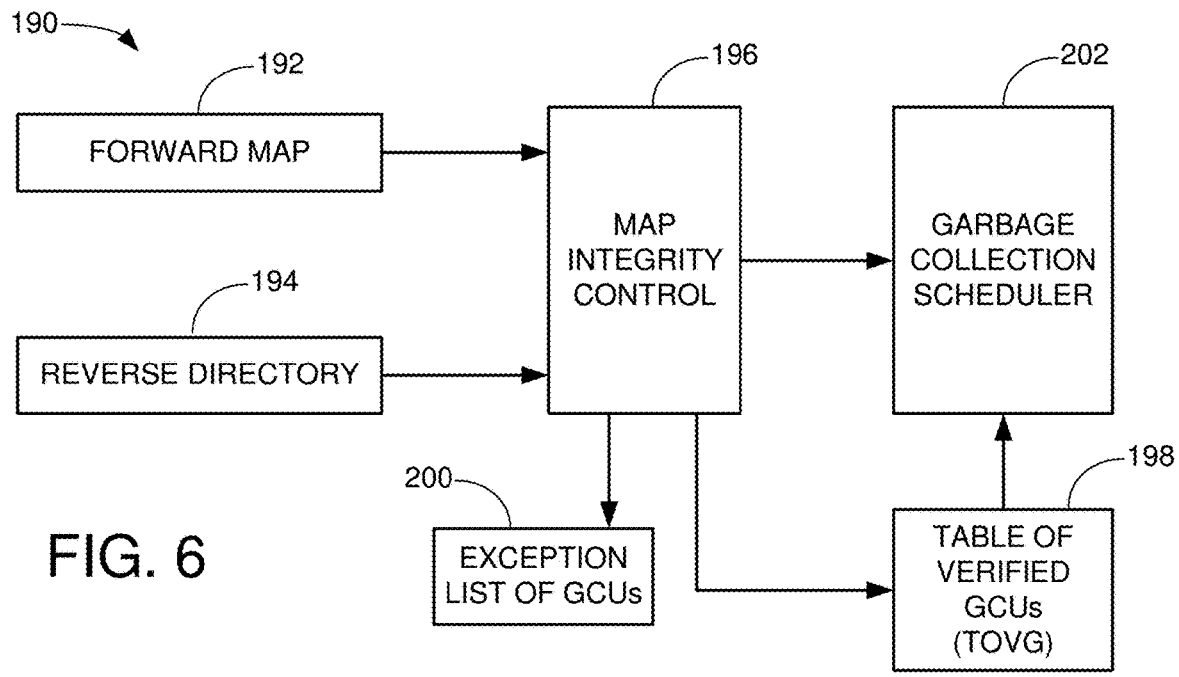
FIG. 6 displays a functional block diagram for a GCU management circuit of the SSD in accordance with some embodiments.

FIG. 6 shows a functional block diagram for a GCU management circuit 190 of the SSD 130 in accordance with some embodiments. The circuit 190 may form a portion of the controller 132 and may be realized using hardware circuitry and/or one or more programmable processor circuits with associated firmware in memory. The circuit 190 includes the use of a forward map 192 and a reverse directory 194. As noted above, the forward map and reverse directory are metadata data structures that describe the locations of the data blocks in the flash memory 164. During the servicing of host data transfer operations, as well as other operations, the respective portions of these data structures are located in the flash memory or other non-volatile memory location and copied to local memory 140 (see e.g., FIG. 3).

The forward map 192 provides a flash transition layer (FTL) to generally provide a correlation between the logical addresses of various blocks (e.g., MUAs) and the physical addresses at which the various blocks are stored (e.g., NVMe set, die, plane, GCU, EB, page, bit offset, etc.). The contents of the forward map 192 may be stored in specially configured and designated GCUs in each NVMe set.

The reverse directory 194 provides a physical address to logical address correlation. The reverse directory contents may be written as part of the data writing process to each GCU, such as in the form of a header or footer along with the data being written. Generally, the reverse directory provides an updated indication of how many of the data blocks (e.g., MUAs) are valid (e.g., represent the most current version of the associated data).

The circuit 190 further includes a map integrity control circuit 196. As explained below, this control circuit 196 generally operates at selected times to recall and compare, for a given GCU, the forward map data and the reverse directory data. This evaluation step includes processing to determine if both metadata structures indicate the same number and identify of the valid data blocks in the GCU.

If the respective forward map and reverse directory match, the GCU is added to a list of verified GCUs in a data structure referred to as a table of verified GCUs, or TOVG 198. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 196 find a mismatch between the forward map 192 and the reverse directory 194 for a given GCU, the control circuit 196 can further operate to perform a detailed evaluation to correct the mismatch. This may include replaying other journals or other data structures to trace the history of those data blocks found to be mismatched. The level of evaluation required will depend on the extent of the mismatch between the respective metadata structures.

For example, if the forward map 192 indicates that there should be some number X valid blocks in the selected GCU, such as 12 valid blocks, but the reverse directory 194 indicates that there are only Y valid blocks, such as 11 valid blocks, and the 11 valid blocks indicated by the reverse directory 194 are indicated as valid by the forward map, then the focus can be upon the remaining one block that is valid according to the forward map but invalid according to the reverse directory. Other mismatch scenarios are envisioned.

The mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 200 may be formed as a data structure in memory of GCUs that have been found to require further evaluation. In this way, the GCUs can be evaluated later at an appropriate time for resolution, after which the corrected GCUs can be placed on the verified list in the TOVG 198.

It will be noted that the foregoing operation of the control circuit 196 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

FIG. 6 further shows the GCU management circuit 190 to include a garbage collection scheduler circuit 202. This circuit 202 generally operates once it is appropriate to consider performing a garbage collection operation, at which point the circuit 202 selects from among the available verified GCUs from the table 198. In some cases, the circuit 202 may generate a time of completion estimate to complete the garbage collection operation based on the size of the GCU, the amount of data to be relocated, etc.

As will be appreciated, a garbage collection operation can include accessing the forward map and/or reverse directory 192, 194 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 7:
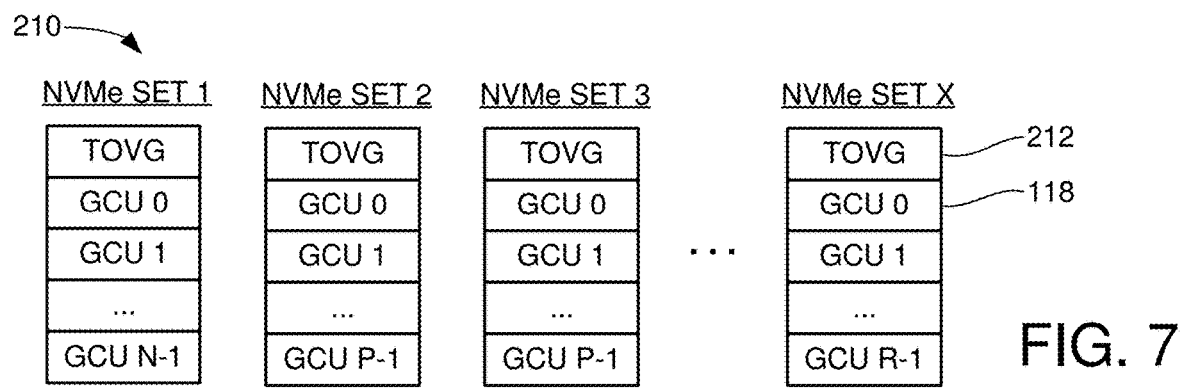
FIG. 7 represents an arrangement of various GCUs and corresponding tables of verified GCUs (TOVGs) for a number of different NVMe sets in some embodiments.

FIG. 7 shows a number of NVMe sets 210 that may be arranged across the SSD 130 in some embodiments. Each set 210 may have the same nominal data storage capacity (e.g., the same number of allocated dies, etc.), or each may have a different storage capacity. The storage capacity of each NVMe set 210 is arranged into a number of GCUs 118 as shown. In addition, a separate TOVG (table of verified GCUs) 212 may be maintained by and in each NVMe set 210 to show the status of the respective GCUs. From this, each time that it becomes desirable to schedule a garbage collection operation, such as to free up new available memory for a given set, the table 212 can be consulted to select a GCU that, with a high degree of probability, can be subjected to an efficient garbage collection operation without any unexpected delays due to mismatches in the metadata (forward map and reverse directory).

Figure 8:
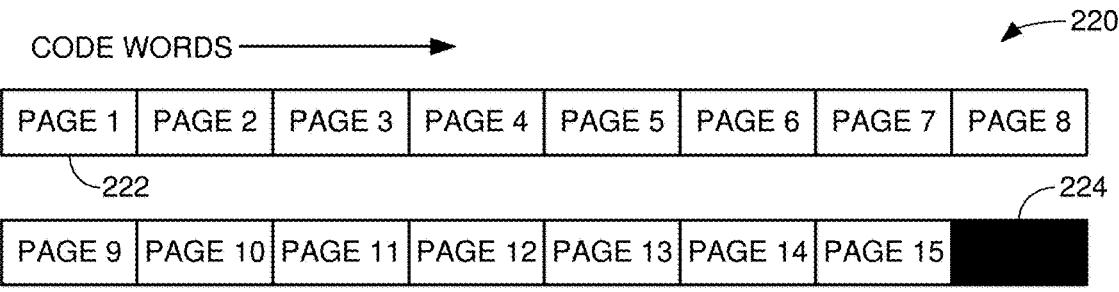
FIG. 8 illustrates an example data set that can be written to the data storage device of FIG. 1 in accordance with assorted embodiments.

FIG. 8 illustrates a manner in which a parity data set 220 can be written to a selected GCU 118 in the flash memory 164 in accordance with some embodiments. In this example, it is contemplated that the selected GCU 118 is formed from sixteen (16) erasure blocks 116, with each of the erasure blocks disposed on a different die 166. Other sizes can be used as desired.

In FIG. 8, the parity data set has fifteen (15) user data pages 222, with each user data page, or payload, written to a different one of the dies. More generally, the GCU has N erasure blocks on a corresponding N dies, and payloads 222 are written to N−1 of the dies. The Nth die receives an outer code (parity value), which is represented at 224. As mentioned above, the outer code may be generated by summing the page data in a buffer using an XOR function. Because the parity data set 220 has data boundaries that nominally match the GCU boundaries, the parity data set in FIG. 8 is referred to as a standard parity data set since the data matches the available memory.

Figure 9:
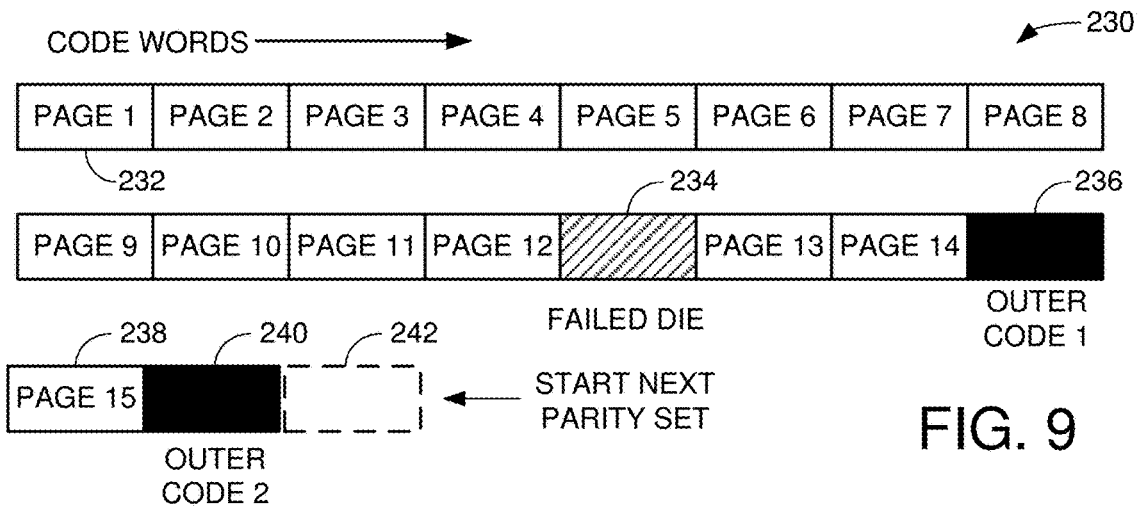
FIG. 9 is an example non-standard data set that may occur in the data storage device of FIG. 1 in accordance with various embodiments.

FIG. 9 shows an example non-standard parity data set 230. The parity data set 230 is the same size as the parity data set 220 in FIG. 8 in that, as before, the parity data set 230 has a total of fifteen (15) pages/payloads 232. However, one of the dies 166 has experienced a failure, as indicated at 234, so that the GCU only spans 15 dies.

Accordingly, the controller circuit 132 (FIG. 3) operates to write a full set of the available pages, which in this case is Page 1 to Page 14, through the available dies. This is followed by the writing of a first outer code (parity value) in the Nth location, as shown at 236, which protects the payloads (Page 1 to Page 14) written during this first pass through the available dies.

A leftover payload 238 (Page 15) is written to the next available page in the first die (such as adjacent Page 1). This leftover payload is referred to as a runt or runt data, and represents the remainder after an integer number of passes have been made through the available dies. Once all of the leftover payloads have been written, a second outer code (parity value) is written in the next available die, as shown at 240. This second outer code is disposed in the same die as, and is adjacent to, the Page 2 payload.

In this way, when leftover (runt) payload sets remain, these are written to as many additional dies as are required, followed by the writing of a final parity value to cover the runts. Map data may be generated to note the non-standard outer code arrangement. This provides a parity data set with a parity value to protect each pass through the dies, plus another parity value to cover the remainder.

While FIG. 9 shows the non-standard parity data set has arisen due to a non-standard sized available memory (e.g., due to the die failure at 234), other non-standard parity data sets can arise based on other factors. For example, a particular data set to be written to a given NVMe set may make up a total number of MUs that do not align with the GCU boundaries. In another case, data compression or other processing may result in a non-standard sized parity data set. It will be appreciated that if a given GCU has N dies, then a non-standard sized data set will have a total number M payloads (or portions thereof) that are not divisible by N without a remainder. The remainder could be any value from one extra payload up to N−1 extra payloads. Regardless, each pass through the dies will be parity protected, irrespective of the overall length of the parity data set.

Once a non-standard parity data set is written, map data may be generated and stored to indicate the fact that the parity data set is of non-standard length. Information may be stored in the map data such as how much longer the data set is in terms of additional pages in the remainder, the location of the last parity value (e.g., 240), etc. To maximize data density, the controller may operate to initiate the writing of the next parity data set at the next available page on the next die in the sequence, as shown at 242 in FIG. 9.

Figure 10:
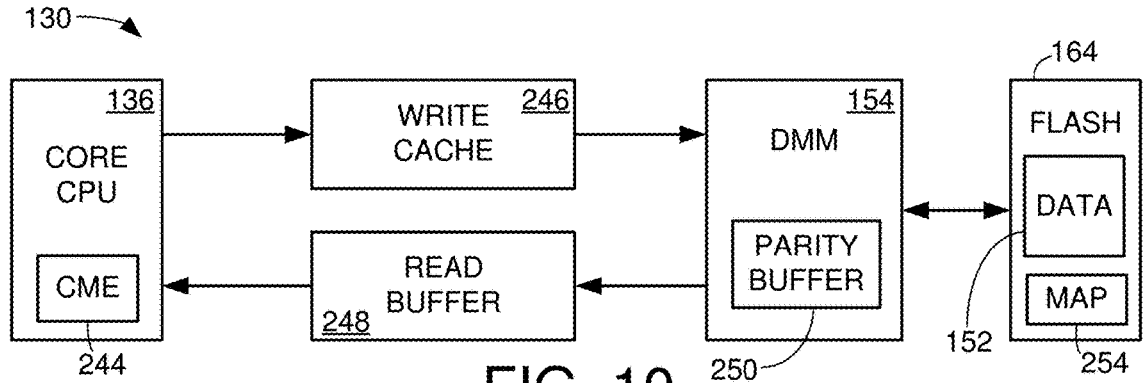
FIG. 10 shows a functional block representation of an example data storage device configured in accordance with some embodiments.

FIG. 10 shows a functional block representation of additional aspects of the SSD 130. The core CPU 136 from FIG. 3 is shown in conjunction with a code management engine (CME) 244 that can be used to manage the generation of the respective code words and outer code parity values for both standard and non-standard parity data sets During write operations, input write data from the associated host are received and processed to form MUs 180 (FIG. 5) which are placed into a non-volatile write cache 246 which may be flash memory or other form(s) of non-volatile memory. The MUs are transferred to the DMM circuit 154 for writing to the flash memory 164 in the form of code words that contain user data, inner code, and outer code. During read operations, one or more pages of data are retrieved to a volatile read buffer 248 for processing prior to transfer to the host.

The CME 244 determines the appropriate inner and outer code rates for the data generated and stored to memory. In some embodiments, the DMM circuit 154 may generate both the inner and outer codes. In other embodiments, the DMM circuit 154 generates the inner codes (see e.g., LDPC circuit 160 in FIG. 3) and the core CPU 136 generates the outer code words. In still other embodiments, the same processor/controller circuit generates both forms of code words. Other arrangements can be used as well. The CME 244 establishes appropriate code rates for both types of code words.

During generation of the outer codes, a parity buffer 250 may be used to successively XOR each payload being written during each pass through the dies. Both payload data 252 and map data 254 will be stored to data locations in flash 164.

Figure 11:
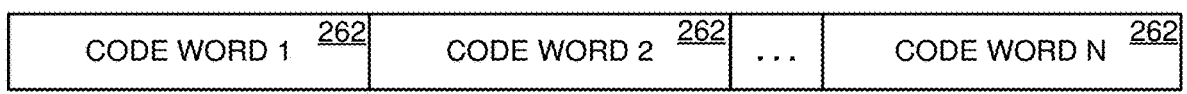
FIG. 11 displays a block representation of portions of an example data storage device arranged in accordance with assorted embodiments.
Figure 11:

FIG. 11 is a block representation of portions of an example data storage device 260 in which data is arranged into a plurality of code words 262 that can efficiently be stored, and retrieved, from one or more SSD storage destinations. A page 150 of data may comprise a number of consecutive, or non-consecutive, code words 262 organized to effectively fit in the available space of an SSD.

As shown, a code word 262 can consist of user data 264 and inner code 266 generated to complement the user data 264, such as by the LDPC circuitry 138. The inner code 266 can provide a diverse variety of capabilities, such as error correction via error correction code (ECC), data status, data offset, and other data control information. The combination of user data 264 and inner code 266 together in a code word 262 allows for efficient analysis, verification, and correction (if necessary) of errors in reading, or writing, the user data 264 to/from memory. However, the inner code 266 may be insufficient, in some cases, to overcome and/or correct errors associated with storage of the code word 262. Hence, various embodiments generate outer code that provides higher-level data analysis and correction in complementary fashion to the inner code 266.

Figure 12:
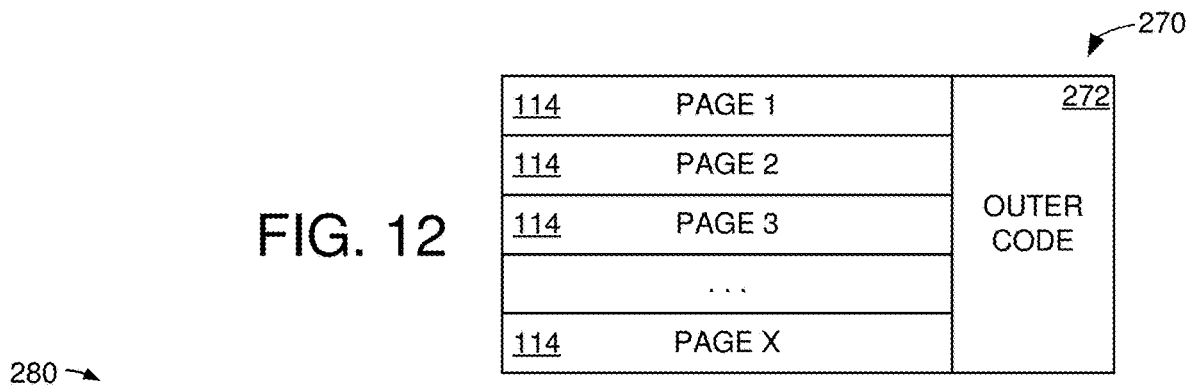
FIG. 12 shows a block representation of portions of an example data storage device configured in accordance with various embodiments.

FIG. 12 conveys a block representation of a portion of an example data storage device 270 where pages 150 of code words 262 are stored in combination with outer code 272 in accordance with some embodiments. The outer code 272 may be associated with one or more pages 150 of code words to provide data that describes the constituent code words 262 and allows for verification and correction of the accuracy, and reliability, of the user data of the respective code words 262.

It is contemplated that the outer code 272 can operate to correct errors and faults that occur during the reading, or writing, of the code words 262. Such corrective function of outer code 272 allows user data to be retrieved despite encountered errors/faults that were uncorrectable by inner code 266. In some embodiments, a probation counter for the user data and/or the physical address of memory where the user data 264 is stored is maintained in the inner code 266, outer code 272, or elsewhere in memory to allow a physical address and/or user data to be monitored in real-time with simple polling of the probation counter.

The ability to correct and recover from encountered error during data access operations to a memory provides additional longevity and reliability for a memory and the data stored therein. However, this ability comes at a relatively high system resource price as processing, storage capacity, and time are expended to correct errors and recover data. The use of such system resources can jeopardize the data storage and retrieval performance for some, or all, of a distributed data storage system. Regardless of the sophistication, efficiency, or accuracy of error/failure recovery in a data storage device, the inefficient retrieval of stored data can jeopardize the performance of a data storage device as well as reduce the operational lifespan of the memory constituent in the device.

Figure 13:
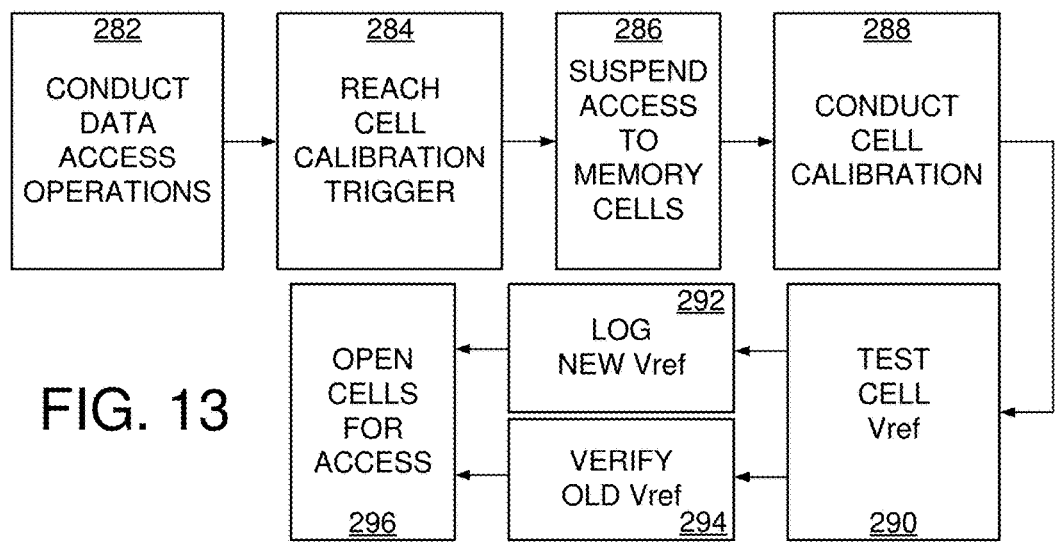
FIG. 13 depicts a timeline of an example defect and calibration procedure that may be employed by some embodiments of a solid-state memory.

FIG. 13 depicts a timeline of an example memory cell calibration procedure 280 that can be conducted in a solid-state memory in some embodiments. At any time after a data storage system is established and initialized, data accesses are executed in response to requests by one or more hosts in step 282. The execution of data access operations can trigger a background operation in step 284 that involves the calibration of one or more memory cells. It is contemplated that a background operation in step 284 can involve other activity besides cell calibrations, such as garbage collection, defect scanning, error recovery, and data reorganization.

With memory cell calibration, cells are isolated from access in step 286 while each cell undergoes calibration in step 288 via data reading, data writing, and data erasing in an effort to discover the optimal reference read voltage to differentiate between logical states stored in the cell. For a single level cell (SLC), a single read reference voltage differentiates between a logical zero and a logical one while a multi-level cell (MLC) will have multiple different read reference voltages to partition between a multi-bit logical state, such as 00, 01, 10, and 11. The writing, reading, and erasing of data in a memory cell can be time and system resource intensive that is compounded by the inaccessibility of the memory cells to service host data access requests during the calibrations.

Through the testing of one or more read reference voltages in step 290 as part of a cell calibration operation, at least one cell reference voltage can be discovered that provides the optimal differentiation between logical states for the current structural configuration of the memory cell. That is, testing of one or more calibration voltage values for a memory cell can indicate that the current read voltage assigned to the cell is sub-optimal, such as corresponding with greater than acceptable data read latency, data write latency, or risk of data access errors. In the event a tested read voltage value for a cell is different than the current value assigned to a cell, step 292 logs the new test voltage value to replace the existing, sub-optimal value. However, if the currently assigned voltage value matches the tested optimal cell value, step 294 logs the current read reference voltage as verified and optimal until the next calibration.

The calibration of all memory cells in an assigned calibration group, which can be a physical correlation, such as a die, plane, or page of memory cells, or can be a logical correlation, such as a garbage collection unit or other organization of memory cells from different physical memory structures, such as from different planes, allows the calibrated cells to be activated in step 296 to service data access requests from one or more connected hosts. While effective at verifying or correcting reference voltages for memory cells of physical and/or logical groups, cell calibration operations are time and resource demanding. It is noted that the memory cell downtime from servicing data access requests and the usage of the finite data writing lifespan of solid-state memory further exacerbates the practical costs of the calibration operations for a data storage system.

Figure 14:
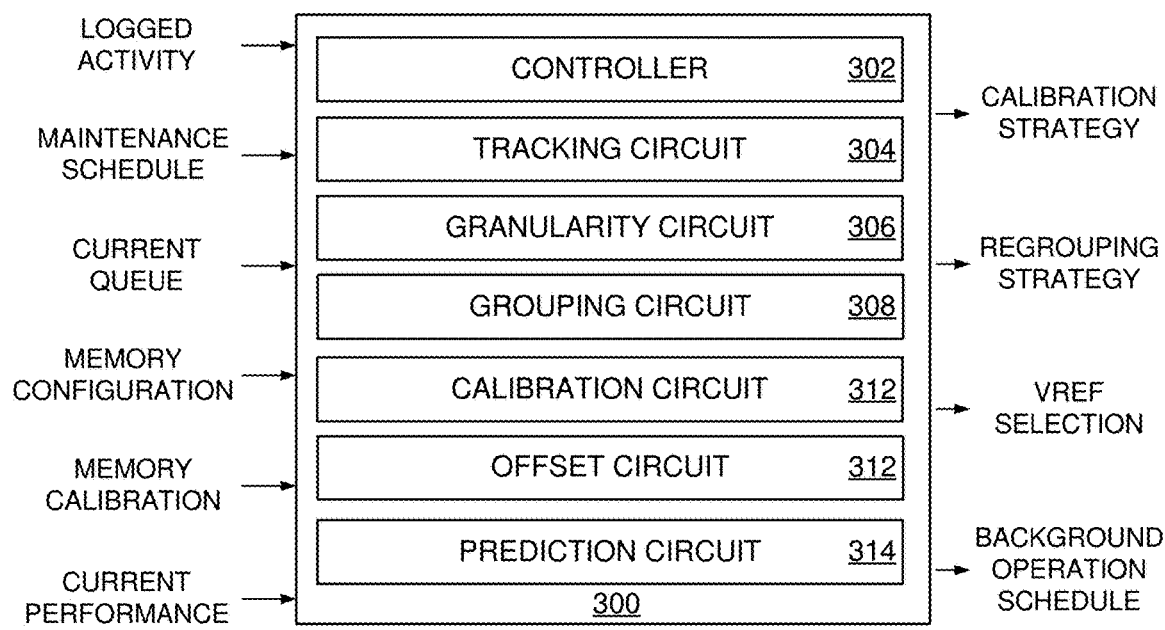
FIG. 14 depicts a block representation of portions of an example monitor module that can be utilized in various embodiments of a solid-state memory.

Accordingly, various embodiments employ a monitor module 300 to intelligently identify cell calibration opportunities and execute cell calibration to mitigate the degradation of data access performance as well as memory cell lifespan. FIG. 14 conveys a block representation of an example monitor module 300 that can be realized as hardware and software in any part of a data storage system employing at least one solid-state memory. A local controller 302, such as a microprocessor or other programmable circuitry, can direct the monitor module 300 to translate a variety of different input data to create at least a calibration strategy, a regrouping strategy, a quick-cal strategy, a schedule for background operations for portions of a solid-state memory, and reference voltages that can be used to efficiently test and calibrate solid-state memory cells.

While not limiting, the monitor module 300 can input assorted current and past logged conditions for at least the solid-state memory portions of a data storage system. For instance, the current physical block addresses of various calibration groups, the addresses of past data access errors and failures, the current physical and logical configurations of memory, and the pending data operations to the memory cells can be utilized individually, and collectively, to understand current cell calibration settings and operational parameters as well as future cell calibration opportunities that can be built into the respective strategies generated by the module 300.

The module controller 302 can operate alone to generate and maintain the various solid-state memory strategies. However, some embodiments employ assorted circuitry to aid the module controller 302 in efficiently creating, altering, and executing the respective output strategies, background operation schedule, and reference voltage values. As shown, a tracking circuit 304 can generate and maintain one or more logs of data access activity and memory operations that can be pertinent to identifying when, and if, cell calibrations can provide tangible data access performance benefit for the processing and time overhead expended by calibration operations.

The tracking circuit 304 can set, and alter, the metrics which it logs over time and the granularity for which those metrics are tracked. For instance, the temperature for an entire solid-state memory can initially be logged by the tracking circuit 304 before altering the granularity of the temperature tracking to a per-die or per-plane basis, as directed by the module controller 302 and at least one predetermined strategy. The ability to alter which data access and/or memory metrics are tracked, and at what granularity, allows the monitor module 300 to conduct efficient and lightweight cell calibration evaluations and determinations without degrading data access performance or delaying scheduled operations to various solid-state memory cells.

Although the tracking circuit 304 can select various metric granularities alone, a granularity circuit 306 can provide granularity analysis and recommendations to the module controller 302 for any strategy and/or circuitry. That is, the granularity circuit 306 can evaluate the current and pending data access metrics being tracked, the size of cell calibration groups, and the physical locations of cells in a calibration group to recommend alterations in granularity to improve the efficiency, timing, and/or decision to conduct cell calibrations. It is contemplated that the granularity circuit 306 suggests different granularities for cell calibrations to accommodate different available system resources, such as processing, data capacity, cell write counts, and background operations. The capability to prescribe different granularity for tracking data access activity and conducting cell calibrations allows the module controller 302 to generate better strategies and alter existing strategies based on current, pending, and predicted future data access activity and memory cell conditions.

A grouping circuit 308 can evaluate and recommend at least organizations of memory cells into calibration groups. The grouping circuit 308 may poll other module circuitry to determine the current, pending, and predicted future activity of various physical data addresses in memory as well as the error/failure rate and past calibration history of those addresses. Such activity allows the grouping circuit 308 to recommend groupings of physical block addresses for calibration purposes as well as for background operations. In the event the grouping circuit 308 determines an existing calibration grouping of memory cells is not optimal for current, and/or predicted future, data access activity, the grouping circuit 308 prescribes a new grouping of cells, which may involve establishing a new group and/or altering one or more existing calibration groups. With a new grouping of cells, the next calibration operation will establish a uniform reference voltage for each cell of the group and the new grouping will then commence operation as a group, regardless of whether the cells are in a different group for background operations, such as garbage collection.

The setting of the calibration group size, location, and timing leads to the execution of cell calibrations with the calibration circuit 310. The execution of cell calibration can be customized with the calibration circuit 310 by altering a default reference test voltage, data being written, number of cell data rewrites, and number of cell data erases. The ability to monitor and alter the mechanism of calibrating a memory cell with the calibration circuit 310 allows the monitor module 300 to customize how calibration groups are actually calibrated, which allows for a diverse range of system resources and time to be utilized for cell calibration. In addition, customized cell calibration with the calibration circuit 310 can alleviate the number of data write cycles during calibration to reduce the impact of cell calibration on memory cells having higher overall write/erase cycles and are closer to a finite lifespan of reliable data storage.

While calibration involving the writing and reading of assorted test voltages can provide the most thorough and precise operational reference voltage for a cell, such calibration can be detrimental to high write count cells and when system resources cannot efficiently be allocated. Hence, an offset circuit 312 can generate simple cell calibrations with a reference voltage offset value involving no writing or erasing of data. A offset cell calibration can be generated as a static adjustment to the existing cell reference voltage, which can be tested by reading data from a cell, but does not write or erase data to the cell. The intelligent selection of an offset voltage value by the offset circuit 312 can involve evaluating past cell calibration adjustments and catering those values to the past operational data access history of calibrated cells to provide improvements in data access performance, such as risk of errors/failures, data read latency, and data write latency.

The offset circuit 312 can operate in conjunction with the calibration circuit 310, in some embodiments, to generate a quick-cal strategy where a limited number of test data write and erases are conducted. For instance, a full calibration can involve the writing and erasing of several different test data while a quick-cal calibration involves a single test data write that is then read with a series of different test reference voltages to determine a reference voltage that will provide greater data access performance. With the quick-cal strategy and operation of the monitor module 300, current and future memory operations can be used to intelligently determine which calibration mode (full, quick-cal, offset) provides the best balance between expended system resources to the data access performance gain.

It is noted that various operational aspects of memory cells and data accesses for the monitor module 300 can be predicted based on model data from other memory and/or from logged activity from the solid-state memory being currently calibrated. A prediction circuit 314 can input assorted current and past operations, actions, and activity, along with model data from other memory, to forecast at least one future memory condition, data access request, or data access performance. The accurate prediction of memory condition and data access performance allows the respective strategies generated by the monitor module 300 to have calibration adaptations to mitigate, or completely avoid, a forecasted future operational occurrence. The prediction circuit 314 can further forecast how long different cell calibrations will take for varying system conditions, which allows the module 300 to quickly adjust calibration location, granularity, and mode to provide a practical calibration improvement for a cell without unduly stalling or degrading overall data storage system performance.

Figure 15:
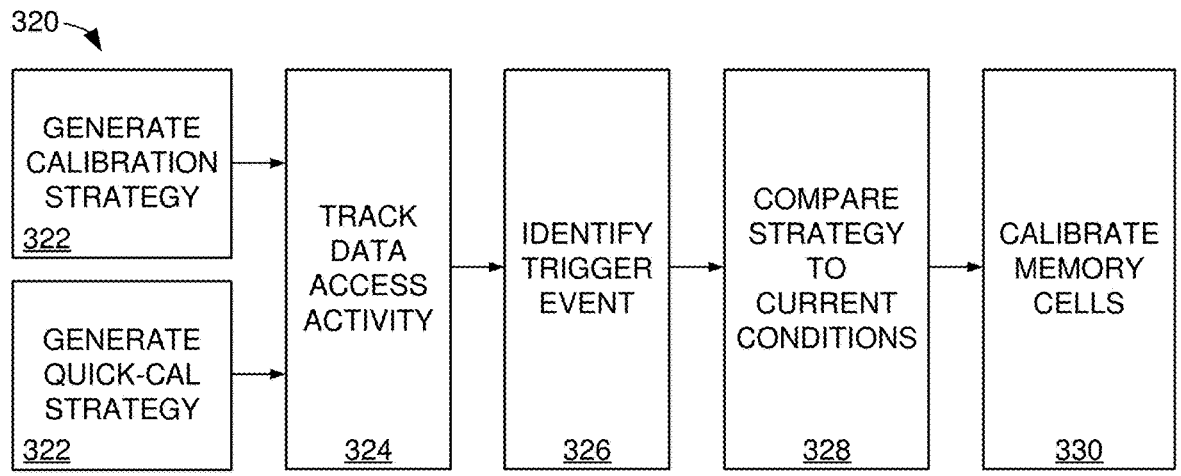
FIG. 15 depicts a timeline of an example calibration procedure utilized in accordance with some embodiments.

FIG. 15 depicts an example calibration procedure 320 that can be carried out in a solid-state memory via a monitor module in accordance with some embodiments. The connection and initialization of at least one solid-state memory into a data storage system allows at least one strategy to be generated in step 322. A generated strategy may involve one or more modes of calibration and can comprise test reference voltages to be used in a cell calibration, as illustrated in FIG. 14. A strategy is then generally employed as one or more data access and/or memory conditions are tracked in step 324 by a monitor module. It is noted that the types of metrics, and the granularity of which those metrics are tracked, can be adjusted over time by the monitor module to identify the current and pending status of memory cells and data access requests.

The tracking of metrics can discover a cell calibration trigger in step 326, such as an error, a number of data accesses, a number of cell write/erase cycles, a drop in predicted data access performance, or a perceived change in memory cell nominal operation. In some embodiments, step 326 involves a timed trigger where a predetermined amount of time has passed since a calibration group of memory cells have been calibrated. Regardless of the trigger, step 328 proceeds to compare the predetermined calibration strategy to the current data storage condition of the solid-state memory. The comparison in step 328 allows the monitor module to determine if the strategy is to be followed as-prescribed. If the current conditions of the memory are conducive to the existing strategy, step 330 subsequently executes the calibration prescribed by the strategy, such as location, size, mode, and number of tested different reference voltages. If the comparison in step 328 discovers differences in the strategy versus the current memory condition, step 330 is conducted with at least one calibration parameter altered by the monitor module to provide a balance between system resources expended to calibrate and the improvement in memory operation resulting from the calibration.

The ability to employ an existing calibration strategy allows the monitor module to identify and act on a detected calibration trigger quickly while the comparison of the strategy to current, real-time detected memory conditions ensures the execution of cell calibration is customized to provide maximum improvement in the performance of the calibrated cell for the system time and resources available. The execution of a calibration strategy with respect to balancing available system resource to the need for memory cells to be calibrated provides tangible benefits in the expenditure of time and system resources, which is not guaranteed with all triggered calibrations.

Figure 16:
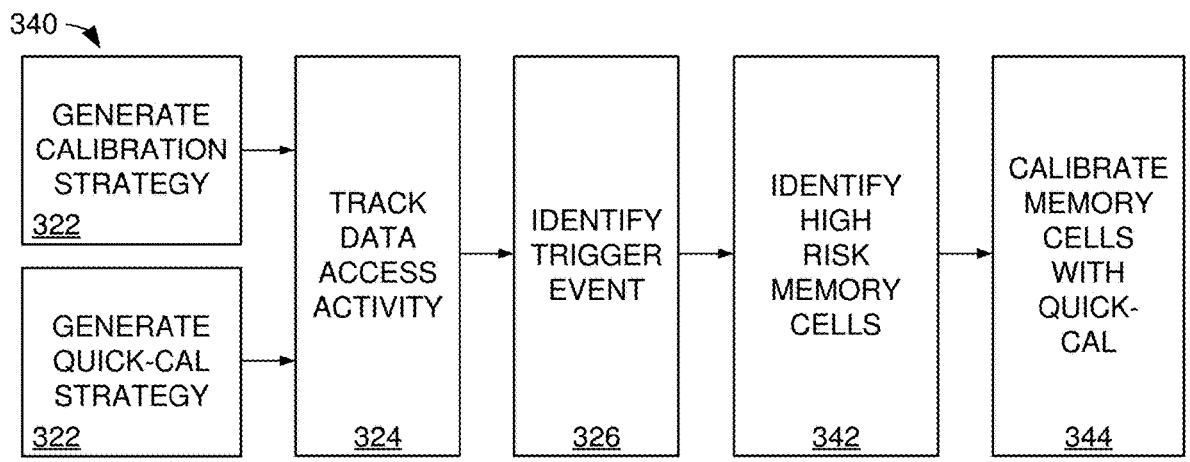
FIG. 16 depicts a timeline of an example calibration procedure executed in accordance with assorted embodiments.

FIG. 16 depicts an example quick-cal procedure 340 that can be carried out with a monitor module on memory cells of a solid-state memory in accordance with assorted embodiments. Much like calibration procedure 320, at least one strategy is generated in step 322 after a solid-state memory is initialized and capable of servicing external host requests. The data accesses and memory conditions are subsequently tracked in step 324, which leads to the identification of a calibration trigger in step 326.

Next, the memory cells to be calibrated according to the existing calibration strategy are evaluated in step 342 compared to current and pending memory and data access activity. A determination in step 342 that at least one memory cell is at high risk as a result of a full calibration called for in the existing calibration strategy prompts the monitor module to change to a quick-cal mode of calibration in an effort to save the operational viability of the identified memory cells. That is, the monitor module can pivot from a full calibration where test data is written and erased to find an optimal reference voltage to a quick-cal strategy that prescribes a limited number of test data writes/erases, such as one. It is contemplated that an offset calibration strategy is employed in step 344 instead of a quick-cal calibration so that no test data is written, or erased, from a memory cell being calibrated.

The selected cell calibration mode may be then verified for effectiveness by reading data with the calibrated reference voltage. The verification of cells may occur in combination with the servicing of data access requests and/or background operations to save system resources and cell downtime. By identifying memory cells as high risk as a result of prescribed calibration operations and pivoting to a less-invasive cell calibration, the monitor module can provide intelligent memory cell calibrations that accommodate the current and predicted future condition and activity of memory cells. As a result, the monitor module provides optimal intelligent administration of cell calibrations.

Figure 17:
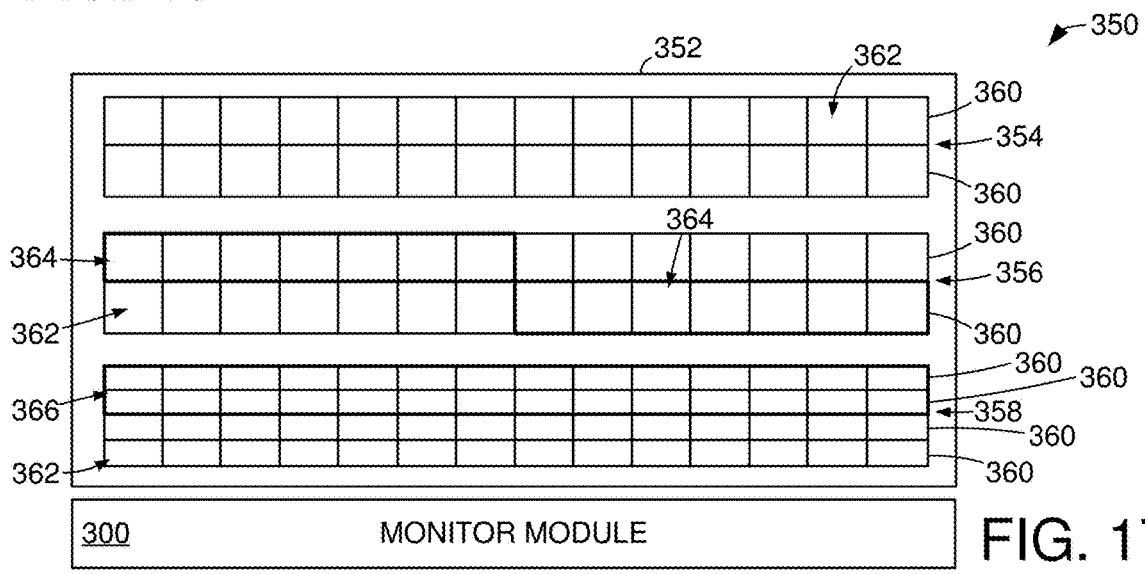
FIG. 17 depicts a block representation of portions of an example solid-state memory configured and operated in accordance with some embodiments.

The calibration of memory cells with customized calibration modes and parameters can provide improved, cell-conscious execution of calibration operations. However, a monitor module may further evaluate and administer alterations in the logical organization of memory cells to intelligently provide optimal cell performance and maintenance moving forward. FIG. 17 depicts a block representation of portions of an example data storage device 350 configured and operated in accordance with various embodiments. The device 350 consists of at least one solid-state memory 352 connected to a monitor module. The memory 352 is physically arranged into a plurality of different die 354, 356, and 358 that each have a number of planes 360 consisting of blocks 362 of memory cells. It is noted that blocks of memory cells can be replaced by pages of memory cells without altering the organization or function of the memory. It is contemplated that some planes 360 are configured with single level cells that have two logical states while other planes 360 have multi-level cells that have more than two logical states.

The connected monitor module 300 can optimize the operation of the various memory cells of the memory 352 by generating calibration and regrouping strategies capable of being applied to different memory cell configurations and altered to adapt to changing data storage conditions. For instance, the monitor module 300 can utilize different calibration modes and calibration groupings for different portions of memory 352 based on the configuration of the memory itself, such as single or multi-level cells, and/or based on the use of the memory, such as containing out-of-date data, excessive data access count, or pending data accesses.

As a non-limiting example, the monitor module 300 can establish a first calibration group that consists of an entire memory die 354 where a single reference voltage is utilized to read data from any memory cell of the group. Upon detection of sub-optimal memory cell grouping by the monitor module 300, cells can be reorganized into a different calibration group, as illustrated by bold regions 364. The dynamic regrouping of memory cells into different calibration groups can be prompted by any sub-optimal determination by the monitor module 300, such as for wear-leveling of data accesses, changed operational performance, or increased error/failure rate.

The monitor module 300 can execute an existing regrouping strategy to efficiently adapt to discovered sub-optimal calibration grouping. It is contemplated that the monitor module 300 can alter an existing regrouping strategy to customize to the current and pending data access activity of the memory 352. The regrouping of cells is not limited to a particular mechanism and can involve dividing, aggregating, and distributing memory cells. In the example shown by the second group 364 in FIG. 17, a calibration group comprises less than all the blocks 362 from different planes 360 of the second die 356. Another non-limiting example in FIG. 17 has half the planes 360 of the third die 358 as a calibration group 366.

These calibration groups can be arranged logically by the monitor module 300 without the actual moving of data to new physical block addresses, but such data movement is contemplated. It is noted that the reorganization of memory cells as part of a regrouping operation is not required to correspond to a calibration operation. That is, memory cells can be regrouped according to a regrouping strategy without immediately conducting a calibration operation on the regrouped cells. The regrouping of cells can accomplish multiple goals, such as changing group granularity, distributing calibration frequency, and customizing background operation activity, along with providing optimal calibration sets for current and pending data access activity in the memory 352.

A calibration group, or regrouped set of memory cells, is not required to correspond to a garbage collection unit or other background operation affiliation. That is, the assorted memory cells, blocks 362, planes 360, and die 354/356/358 can be logically assigned to multiple different groups concurrently. Such concurrent logical assignment allows the monitor module 300 to customize groups for cell calibration purposes without concern for the impact on background operations. For instance, the monitor module 300 could reorganize a calibration group into smaller groups located on multiple different, physical die 354/356/358 to employ concurrent different die channels for calibration instead of a single channel utilized to calibrate group on a single die.

It is noted that the reorganization of a calibration group via a regrouping strategy does not require alteration of the physical or logical block address of data. Instead, a memory cell having a physical block address is logically associated with a different set of cells to be concurrently calibrated and share a single reference voltage. Through the reorganization of memory cells into different calibration groups, the monitor module 300 can repeatedly optimize when and how cells are calibrated based on real-time detected data access activity and memory conditions. The regrouping of memory cells based on a predetermined strategy allows for efficient implementation with minimally invasive use of system resources and time, which contrasts generating an altered or new calibration group of memory cells reactively.

Figure 18:
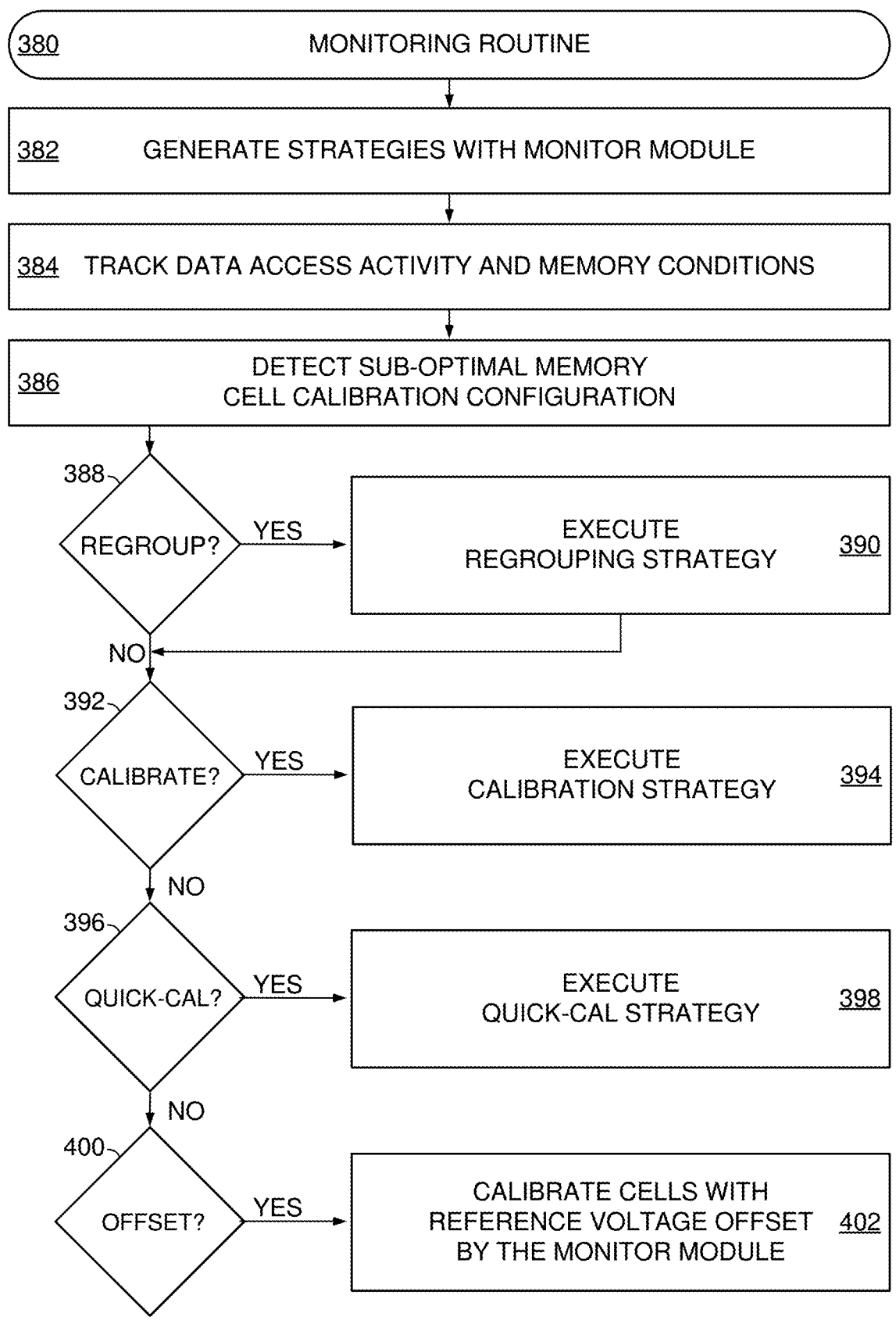
FIG. 18 is a flowchart of an example cell monitoring routine that can be carried out with various embodiments of a solid-state memory.

FIG. 18 depicts an example monitoring routine 380 that can be performed by the assorted embodiments of FIGS. 1-17. The routine 380 can begin any time after at least one solid-state memory is initialized with a monitor module to service data access requests from hosts external to the memory, such as a third-party user. The monitor module generates one or more strategies in step 382 to proactively mitigate or eliminate degradation of memory cell operation via calibration operations. That is, step 382 can involve the monitor module evaluating various detected, logged, and predicted input variables, as shown in FIG. 14, to generate at least calibration and regrouping strategies that prescribe proactive and reactive actions, such as changes in metric tracking granularity, changes to calibration groups, and changes to calibration parameters, to be executed if, and when, a trigger condition is detected by the monitor module.

The generated strategies are then put in place while step 384 tracks the various data access activity and memory conditions over time. The type of metrics tracked and the granularity of those metrics can be set, and altered, by the monitor module to collect the most efficient information to execute or alter the generated strategies to provide optimal calibration operations. For instance, the monitor module may track data write/erase counts on a per-plane granular level before changing to tracking data access latency on a per-block or per-cell granular level. The intelligent tracking of activity and the condition of memory in step 384 allows step 386 to accurately detect a sub-optimal memory cell calibration configuration. It is noted that step 386 may also predict future sub-optimal calibration configurations to trigger the execution of one or more generated strategies.

While the assorted strategies generated by a monitor module can be conducted in any order, decision 388 initially consults the regrouping strategy to determine if the detected sub-optimal calibration configuration can be cured, or improved, by reorganizing one or more memory cells between existing calibration groups or into a new calibration group. If so, step 390 executes the regrouping strategy as previously generated or with one or more alterations customized to the memory cells being regrouped and/or the data access activity to the cells being regrouped.

At the conclusion of the regrouping in step 390, or if no regrouping is deemed beneficial in decision 388, a calibration strategy is consulted in decision 392. If the sub-optimal calibration configuration is cured or improved by a full calibration of one or more calibration groups, step 394 is activated to carry out the existing calibration strategy. However, if a full calibration that involves the writing, reading, and erasing of test data to discover the optimal reference voltage is determined by the monitor module to be more detrimental than beneficial to the detected sub-optimal calibration configuration, decision 396 evaluates if a quick-cal mode of calibration provides a balance of improved memory cell operation with the system resources and time expended for the calibration. If so, step 398 carries out the predetermined quick-cal cell calibration with fewer memory cell writes and erases than the full calibration of step 394.

In the event no quick-cal cell calibration is deemed by the monitor module to provide optimal cell calibration, decision 400 evaluates if an offset calibration improves, or corrects, the detected sub-optimal calibration configuration. Step 402 is activated to alter the reference voltage for at least one calibration group by an offset value selected by the monitor module. If no offset calibration can cure or improve the sub-optimal calibration configuration, the routine 380 returns to step 382 where at least one strategy is altered or regenerated from scratch.

Through the use of dynamic feedback and the intelligent operation of a monitor module, memory cell calibrations can be conducted efficiently and as a balance of the time and system resources used for the calibrations. Tracking various data access and memory metrics, such as error correction, memory temperature, and write/erase counts, allows the monitor module to selectively decide to conduct calibrations and how those calibrations are carried out. The ability to intelligently regroup memory cells into different calibration sets allows the monitor module to creatively implement cell calibrations with minimal degradation of the memory itself or data access performance of the solid-state memory.

What is claimed is:

1. An apparatus comprising:
   a solid-state memory comprising non-individually erasable memory cells;
   a grouping circuit configured to arrange the memory cells into calibration groups, each memory cell in each respective calibration group using a common set of read voltages to sense programmed states of the respective memory cells; and
   a tracking circuit configured to measure at least one read parameter for each calibration group responsive to read operations carried out upon the memory cells in the associated calibration group;
   the grouping circuit further configured to reassign a set of memory cells comprising less than all of the memory cells of a first calibration group into a different, second calibration group in response to the at least one measured read parameter, the reassigned set of memory cells in the second group retaining the programmed states thereof without an intervening garbage collection operation upon the reassigned set of memory cells.

2. The apparatus of claim 1, further comprising a calibration circuit configured to establish a first set of read voltages for use during read operations upon the memory cells in the first calibration group to determine the programmed states thereof and a different, second set of read voltages for use during read operations upon the memory cells in the second calibration group to determine the programmed states thereof.

3. The apparatus of claim 2, wherein the programmed states of the reassigned set of memory cells are sensed using both the first set of read voltages and the second set of read voltages without an intervening data refresh operation upon the reassigned set of memory cells.

4. The apparatus of claim 1, wherein the at least one read parameter comprises a detected read error rate obtained during a read operation upon the reassigned set of memory cells, and wherein the grouping circuit reassigns the set of memory cells from the first calibration group to the second calibration group responsive to the detected read error rate exceeding a predetermined threshold.

5. The apparatus of claim 1, further comprising an offset circuit configured to, responsive to the at least one read parameter obtained by the tracking circuit, apply an offset to the set of read voltages associated with a selected calibration group during a subsequent read operation upon selected memory cells within the selected calibration group.

6. The apparatus of claim 1, further comprising a granularity circuit configured to evaluate at least a selected one of data access metrics being tracked, sizes of cell calibration groups, and physical locations of cells in each calibration group, wherein the grouping circuit is further configured to rearrange the calibration groups responsive to the granularity circuit.

7. The apparatus of claim 1, wherein the second calibration group is a new calibration group made up of memory cells from the solid-state memory having similar data access performance characteristics.

8. The apparatus of claim 1, further comprising a monitor module controller configured to schedule a calibration sequence during which a calibration circuit establishes an updated set of read voltages for a third calibration group responsive to the at least one read parameter determined by the tracking circuit for the third calibration group exceeding a predetermined threshold.

9. The apparatus of claim 8, wherein the monitor module controller is further configured to cancel a previously scheduled calibration sequence for a fourth calibration group responsive to the at least one read parameter determined by the tracking circuit for the fourth calibration group not exceeding the predetermined threshold.

10. The apparatus of claim 1, wherein the solid-state memory comprises a flash memory arranged as a plurality of dies, wherein the memory cells are flash memory cells arranged on the plurality of dies, wherein the memory cells are each configured to store multiple bits as the associated programmed states, wherein the sets of read voltages for each of the calibration groups comprises different reference voltage levels to differentiate the respective multiple bits, wherein the memory cells are further arranged into garbage collection units (GCUs) that are respectively allocated and erased as a unit, and wherein the calibration groups are selected independently of the GCUs so that a selected GCU has memory cells in multiple calibration groups and a selected calibration group has memory cells in multiple GCUs.

11. A method comprising:
arranging a plurality of non-individually erasable memory cells into calibration groups;
performing a calibration operation to determine an associated, set of reference voltages to sense programmed states of the respective memory cells in each calibration group;
measuring at least one read parameter for each calibration group responsive to read operations carried out upon the memory cells in the associated calibration group using the associated set of reference voltages;
reassigning a set of memory cells comprising less than all of the memory cells of a first calibration group into a different, second calibration group in response to the at least one measured read parameter while retaining the programmed states of the reassigned set of memory cells therein; and
subsequently reading the current programmed states of the reassigned set of memory cells in the second group using the associated set of reference voltages for the second calibration group.

12. The method of claim 11, wherein the performing a calibration operation writes, and subsequently reads, test data to at least one memory cell of a selected calibration group to determine a new set of reference voltages.

13. The method of claim 11, wherein the performing a calibration operation establishes a first set of reference voltages for use during read operations upon the memory cells in the first calibration group to determine the programmed states thereof and a different, second set of reference voltages for use during read operations upon the memory cells in the second calibration group to determine the programmed states thereof, and wherein the programmed states of the reassigned set of memory cells are sensed using both the first set of read voltages and the second set of read voltages without an intervening garbage collection operation upon the reassigned set of memory cells.

14. The method of claim 11, wherein the performing a calibration operation alters a reference voltage without writing or reading data to any memory cells of a calibration group by using an offset value added to the reference voltage.

15. The method of claim 11, wherein the at least one read parameter comprises a detected read error rate obtained during a read operation upon the reassigned set of memory cells, and wherein the reassigned set of memory cells are transitioned from the first calibration group to the second calibration group responsive to the detected read error rate exceeding a predetermined threshold.

16. The method of claim 11, wherein the performing a calibration operation is carried out in response to an identification of at least one memory cell of a calibration group being at high risk for failure.

17. The method of claim 11, further comprising rearranging the calibration groups responsive to at least a selected one of data access metrics being tracked, sizes of cell calibration groups, and physical locations of cells in each calibration group.

18. The method of claim 11, wherein the performing a calibration operation comprises establishing an updated set of reference voltages for a third calibration group responsive to the at least one read parameter determined for the third calibration group exceeding a predetermined threshold.

19. The method of claim 18, wherein a previously scheduled calibration sequence for a fourth calibration group is cancelled responsive to the at least one read parameter determined by the tracking circuit for the fourth calibration group not exceeding the predetermined threshold.

20. The method of claim 11, wherein the performing a calibration operation executes multiple different calibration procedures sequentially in response to a changing volume of data access requests to the plurality of non-individually erasable memory cells.

* * * * *